(12) United States Patent
Mooring

(10) Patent No.: US 9,293,317 B2
(45) Date of Patent: Mar. 22, 2016

(54) METHOD AND SYSTEM RELATED TO SEMICONDUCTOR PROCESSING EQUIPMENT

(75) Inventor: Benjamin W. Mooring, Cedar Park, TX (US)

(73) Assignee: LAM RESEARCH CORPORATION, Fremont, CA (US)

( * ) Notice: Subject to any disclaimer, the term of this patent is extended or adjusted under 35 U.S.C. 154(b) by 683 days.

(21) Appl. No.: 13/610,990

(22) Filed: Sep. 12, 2012

(65) Prior Publication Data

US 2014/0072397 A1     Mar. 13, 2014

(51) Int. Cl.
    *H01L 21/677*      (2006.01)
    *H01L 21/00*      (2006.01)
    *H01L 21/67*      (2006.01)

(52) U.S. Cl.
    CPC .......... *H01L 21/00* (2013.01); *H01L 21/67161* (2013.01); *H01L 21/67196* (2013.01); *H01L 21/67207* (2013.01); *H01L 21/67742* (2013.01)

(58) Field of Classification Search
    CPC ................................................ H01L 21/67748
    See application file for complete search history.

(56) References Cited

U.S. PATENT DOCUMENTS

| | | | | |
|---|---|---|---|---|
| 5,695,564 A * | 12/1997 | Imahashi | ...................... | 118/719 |
| 6,503,365 B1* | 1/2003 | Kim et al. | ................ | 156/345.32 |
| 7,988,398 B2 | 8/2011 | Hofmeister et al. | | |
| 2002/0150448 A1* | 10/2002 | Mizokawa et al. | ........... | 414/217 |
| 2005/0111938 A1 | 5/2005 | van der Meulen | | |
| 2008/0232948 A1* | 9/2008 | van der Meulen | ..... | B65G 25/02 414/805 |

* cited by examiner

*Primary Examiner* — Jonathan Snelting

(57) ABSTRACT

Semiconductor processing equipment. At least some of the illustrative embodiments are systems including: a front end robot configured to pull individual wafers from at least one wafer carrier; a linear robot in operational relationship to the front end robot, the linear robot configured to move wafers along an extended length path; and a first processing cluster in operational relationship to the linear robot. The first processing cluster may include: a first processing chamber; a second processing chamber; and a first cluster robot disposed between the first and second processing chambers. The first cluster robot is configured to transfer wafers from the linear robot to the processing chambers, and configured to transfer wafers from the processing chambers to the linear robot.

16 Claims, 7 Drawing Sheets

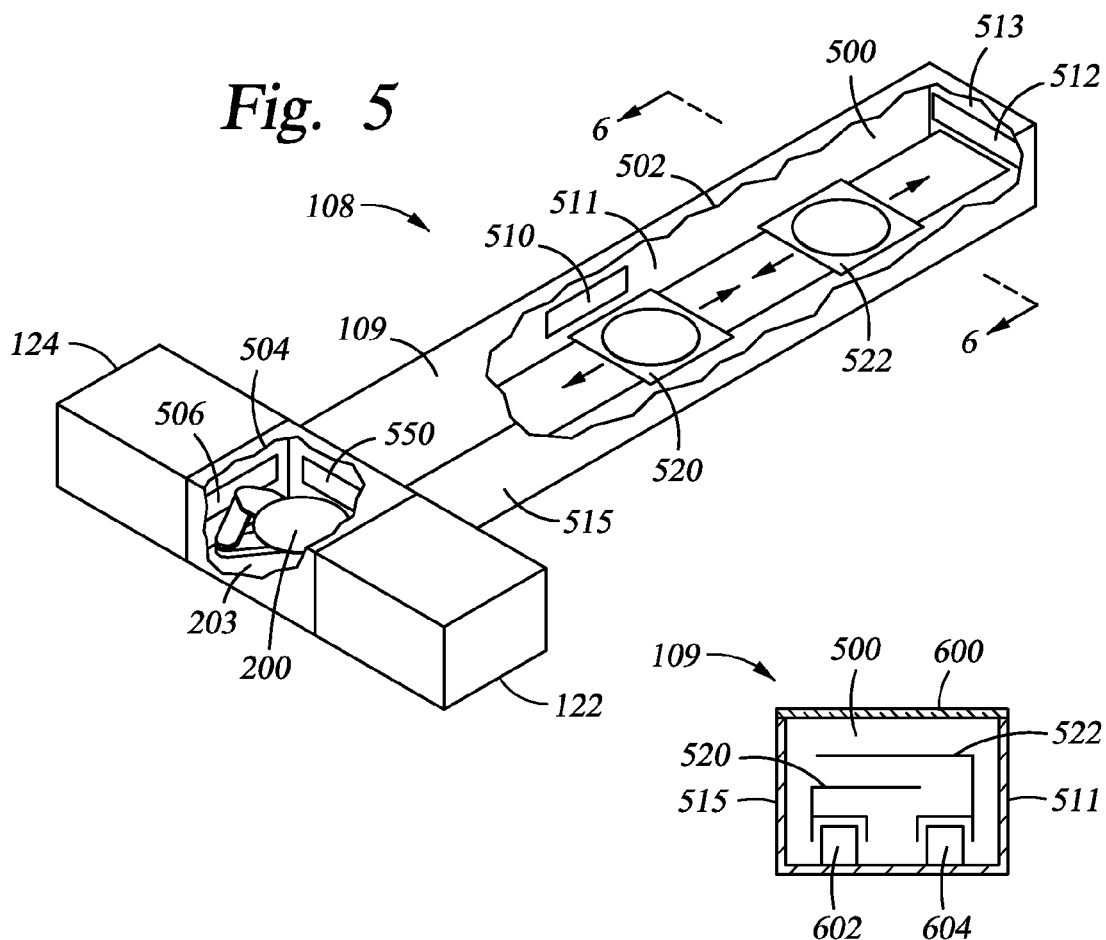
Fig. 5
Fig. 6
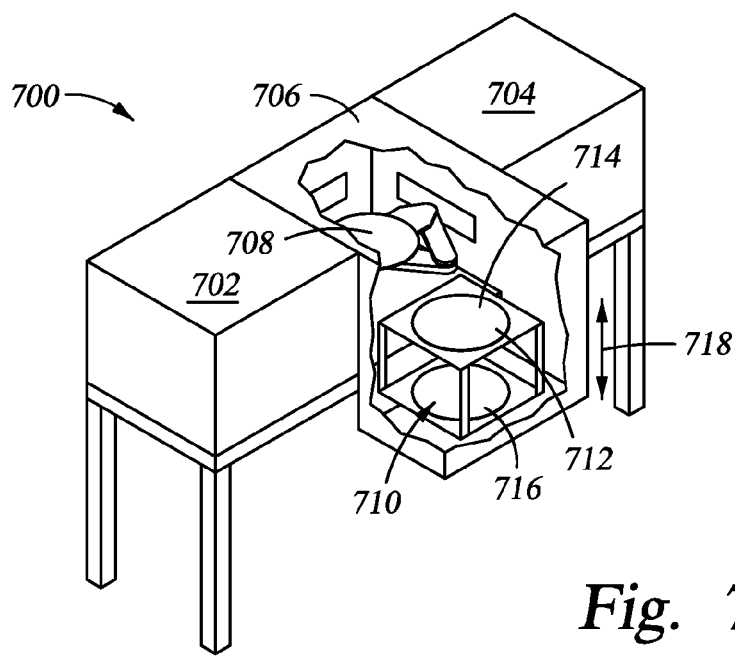
Fig. 7

METHOD AND SYSTEM RELATED TO SEMICONDUCTOR PROCESSING EQUIPMENT

BACKGROUND

As the critical dimensions of semiconductor devices continue to get smaller, the number of processing steps used to create semiconductor devices has increased, and likewise, process times have increased. Moreover, clients are increasingly demanding the ability to perform pre- and post-processing of the wafers in relation to the main processing (e.g., etch, chemical vapor deposition), further increasing the number of configurations that a processing tool must facilitate.

In order to maintain throughput of a fabrication facility, more processing chambers may be needed. To accommodate the pre-processing and post-processing requirements, a wider variation in the types of chambers on a given tool may be needed. However, designing and qualifying new semiconductor processing equipment with additional processing chambers is a long and complicated endeavor.

BRIEF DESCRIPTION OF THE DRAWINGS

For a detailed description of exemplary embodiments of the invention, reference will now be made to the accompanying drawings in which:

FIG. 5 shows a perspective, partial cutaway, view of a linear transfer robot and related equipment in accordance with at least some embodiments;

FIG. 6 shows an elevation view (taken substantially along lines 6-6 of FIG. 5) of the linear transfer robot in accordance with at least some embodiments;

FIG. 7 shows a perspective, partial cutaway, view of a processing cluster in accordance with at least some embodiments;

NOTATION AND NOMENCLATURE

Certain terms are used throughout the following description and claims to refer to particular system components. As one skilled in the art will appreciate, different companies may refer to a component by different names. This document does not intend to distinguish between components that differ in name but not function.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

"Linear robot" shall mean a robotic system that transports wafers such that wafer movement has two degrees of freedom (e.g., horizontal translation along a confined track, and elevation changes relative to the force of gravity) or less. However, linear robot shall not be read to require straight line translation.

"Cluster robot" shall mean a robotic system that transports wafers such that wafer movement has three degrees of freedom or more.

"Extended length path" shall mean a path where an area swept out by moving wafers is at least six wafer diameters in length, but not more than two wafer diameters in width.

"Processing chamber" shall mean a chamber within which semiconductor processing takes place (e.g., etch, deposition, or cleaning) where the chamber defines an internal volume of 8 cubic feet or less.

"Operated at atmospheric pressure" shall not be read to include structures designed for use below atmospheric pressure operated at atmospheric pressure.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various example embodiments are directed to semiconductor processing equipment, and more particularly to semiconductor processing equipment that is easily scalable not only at the design stage, but also at the implementation stage. That is, the various examples of semiconductor processing equipment can be designed to accommodate not only the initially desired number of processing chambers, but also designed to accommodate future expansion of the equipment after initial installation. The specification first turns to a high level overview of semiconductor processing equipment in example systems.

Figure 1:
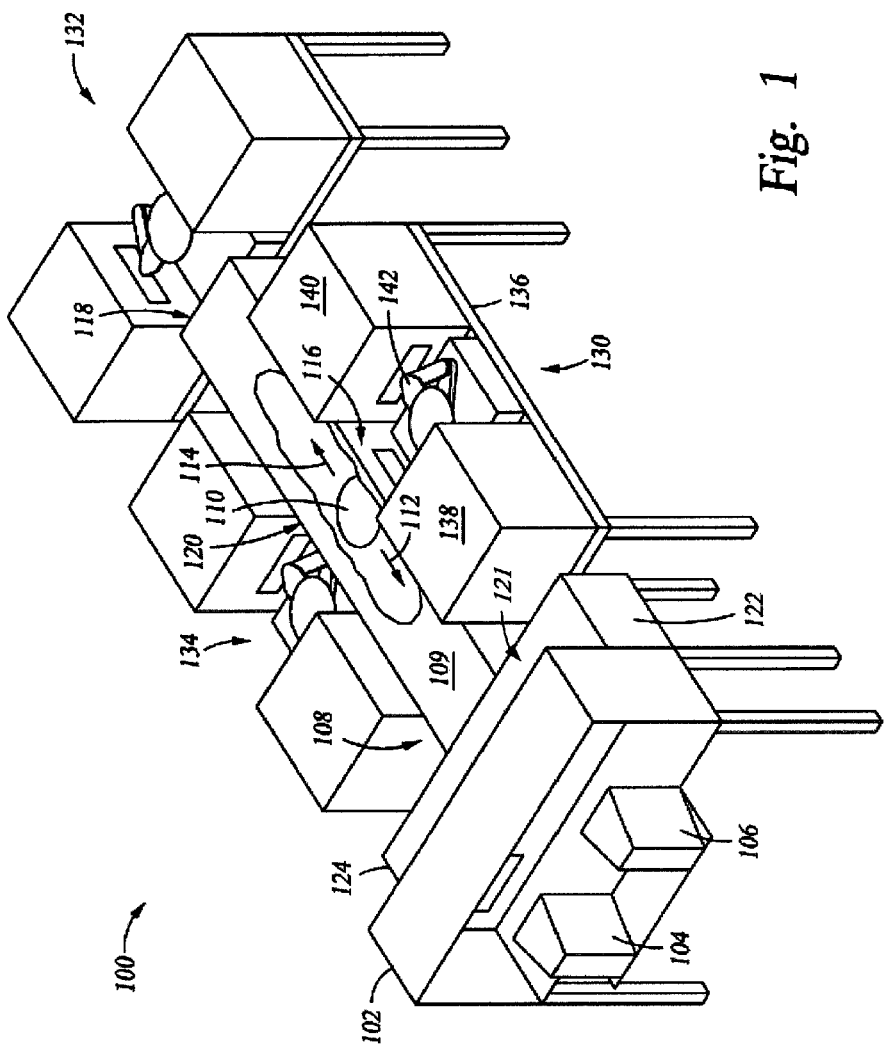
FIG. 1 shows a perspective view of semiconductor processing equipment in accordance with at least some embodiments.

FIG. 1 shows a simplified perspective view, in partial cutaway, of semiconductor processing equipment 100 in accordance with example systems. In particular, FIG. 1 shows that the semiconductor processing equipment 100 comprises a front end robot 102 and related cabinetry. The front end robot 102 is designed and constructed to pull individual semiconductor wafers (hereafter just "wafers") from at least one wafer carrier. The example front end robot 102 is shown in operational relationship with two wafer carriers 104 and 106, but in other example systems the front end robot 102 may interface with one or more wafer carriers. After pulling a wafer from a wafer carrier, the front end robot 102 may provide the wafer to downstream equipment (e.g., robot 200 not visible in FIG. 1, and linear robot 108) for transport to a processing chamber or chambers. Moreover, as wafers are returned from processing chambers (e.g., returned by the linear robot 108), the front end robot 102 may place the wafers back in wafer carriers as appropriate. In some example systems, the front end robot system 102 may be referred to as an equipment front-end module (EFEM). In the example systems, the front end robot 102 is operated at atmospheric pressure, but the front end robot 102 may exchange wafers with downstream systems operated in chambers at less than atmospheric by way of a load lock system.

The semiconductor processing system 100 further comprises a linear robot 108 (disposed within a vacuum chamber 109), the linear robot 108 in operational relationship to the front end robot system 102. Although the linear robot will be discussed in greater detail below, in the example system shown the linear robot 108 interfaces on one end with the front end robot 102 (through the robot 200 of FIG. 2), and the linear robot 108 is configured to move wafers along an extended length path (as illustrated by wafer 110 and arrows 112 and 114 within the cut-away portion). The linear robot 108 defines a plurality of locations at which wafer exchange with processing clusters takes place. In the example system of FIG. 1, the linear robot defines four locations at which wafer exchange may take place, being locations 116 on the closest side in the view of FIG. 1, location 118 on the distal end of the linear robot system 108, location 120 opposite location 116, and location 121 associated with the transfer robot that is not visible in FIG. 1. Having four example locations at which wafer transfer takes, one on each "side" of the linear robot 108, is merely an example. Multiple wafer transfer locations may exist along any particular side, and the wafer transfer location on the distal may be included or omitted as needed.

The example linear robot 108 operates within the vacuum chamber 109 at pressures less than atmospheric, and thus interfaces with the front end robot system 102 by way of load locks 122, 124. That is, the front end robot 102 may place wafers within one of the load locks 122 or 124 while the load lock is at atmospheric pressure. The load lock may then be evacuated, and the wafer placed on a linear robot 108 (by robot 200 of FIG. 2) within the vacuum chamber 109 for transfer along the extended length path. Likewise for returning wafers, the returning wafers may be placed in the load lock (by robot 200 of FIG. 2), the load lock vented to atmosphere, and then the front end robot 102 may retrieve the wafer and place the wafer in a wafer carrier. In the example system of FIG. 1, the linear robot 108 interfaces with the front end robot 102 by way of two load locks; however, depending wafer throughput of the system, a single load lock may be used. It is noted that while the linear robot 108 is shown in FIG. 1 to operate under vacuum, in other cases the linear robot system 108 may be operated at atmospheric pressure (i.e., vacuum chamber not used).

Still referring to FIG. 1, the example semiconductor processing system 100 further comprises three processing clusters 130, 132 and 134. A processing cluster in example systems may comprise one or more process chambers in operational relationship with a cluster robot. Referring to processing cluster 130 as an example, the processing cluster 130 comprises a frame 136 supporting a first process chamber 138, second process chamber 140, and a cluster robot 142 disposed between the process chambers 138 and 140. The cluster robot 142 is configured to transfer wafers to and from the linear robot 108, and is configured to transfer wafers into and out of the process chambers of the processing cluster. In some cases, the cluster robot 142 may transfer a wafer from process chamber 138 to process chamber 140 (or vice versa) if the various processes are related sequentially. Moreover, in order to exchange wafers with the linear robot 108, and likewise to place and retrieve wafers from the process chambers, the cluster robot 142 has at least three-degrees of freedom regarding wafer movement (e.g., two-degrees of freedom in a horizontal plane, and z-axis capability to raise and lower wafers from and onto, respectively, the linear robot 108). It is noted, however, that in the various systems a cluster robot need only handle the wafers to be processed within process chambers associated with the cluster, and it follows that a cluster robot does not handle or touch wafers traveling to and/or from other clusters (unless those wafers are to be processed at the cluster with which the cluster robot is directly associated). Thus, for example, the cluster robot 142 of the processing cluster 130 need not handle or touch wafers destined processing cluster 132 or processing cluster 134.

The example processing chambers 138 and 140 may take any suitable form. In some cases, the processing chambers of a processing cluster may be designed and constructed to perform the same task (e.g., plasma-based metal etch, plasma-based poly etch, plasma-based ash process, wet or dry wafer cleaning, chemical vapor deposition (CVD)). In other cases, the processing chambers may be designed and constructed to perform different, sometimes complementary, tasks. For example, a first process chamber in a cluster may perform a process step for a wafer, and the second process chamber in the cluster may perform the next processing step for the wafer. The processing chambers may be designed and constructed to operate under vacuum (e.g., etch processes, CVD), or the processing chambers may be designed to be operated at atmospheric pressure (e.g., cleaning processes). In most cases, the processing chambers will either all be designed and constructed to operate under vacuum, or all will be designed and constructed to operate at atmospheric pressure.

In the example processing clusters of FIG. 1, each processing cluster has only one "level" of process chamber. For example, process chamber 138 is at the same elevation as process chamber 140. However, in other cases, the process chambers may be offset in elevation, and thus the cluster robot 142 may have z-axis translation capability to enable interaction with each processing chamber. Further still, some processing clusters (particularly "cleaning" clusters operated at atmospheric pressure where wafers are washed or cleaned by any suitable cleaning material) may be stacked. For, example, a processing cluster may have four or more processing chambers—two stacked chambers on one side of the cluster robot, and two stacked chambers on the other side of the cluster robot. Further still, there need be no correspondence as between processing clusters of a single semiconductor processing system. For example, the processing cluster 130 may be designed to perform certain tasks and have two processing chambers, while processing cluster 132 may be designed to perform different tasks and have a different number of process chambers.

Figure 2:
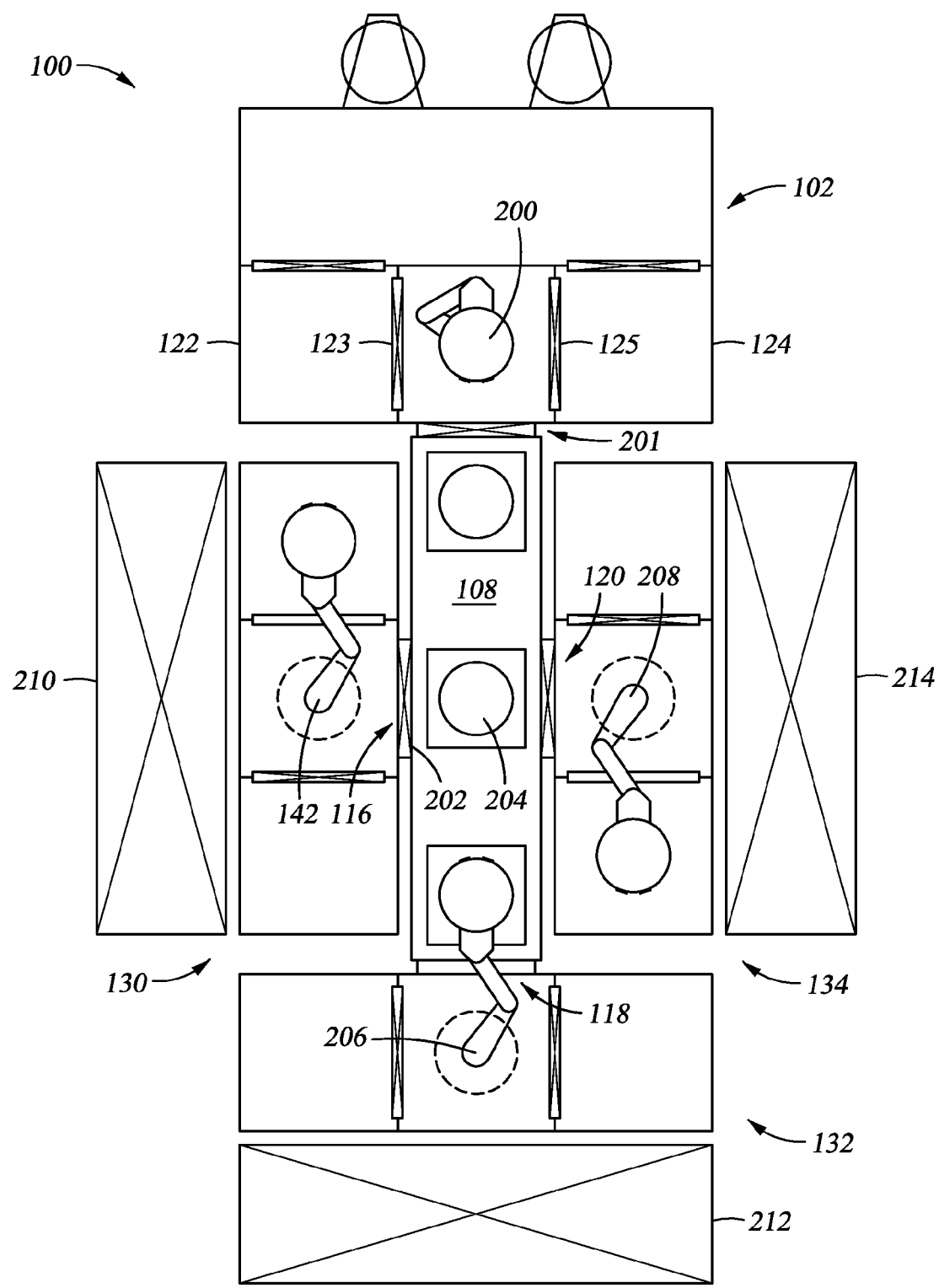
FIG. 2 shows an overhead view of semiconductor processing equipment in accordance with at least some embodiments.

FIG. 2 shows an overhead view of the semiconductor processing system 100 to introduce a shorthand notation for explanation of variations. In particular, FIG. 2 shows semiconductor processing system 100 comprising the front end robot 102 operatively coupled to the linear robot 108 by way of two example load locks 122 and 124. Visible in FIG. 2 is a transfer robot 200 configured to move wafers from the load locks 122 and 124 (through doors 123 and 125, respectively) to the linear robot system 108 for delivery to the processing clusters. The transfer robot 200 is configured to move wafers from the linear robot 108 to the load locks 122 and 124 for placing back in the wafer carriers. In some cases, the transfer robot 200 resides within its own chamber with a door 201 separating the transfer robot 200 from the linear robot 108. In other cases, separate physical chambers may be defined for the transfer robot 200 and linear robot 108, but without a door. Finally, in other cases the transfer robot 200 and linear robot 108 may reside within the same chamber. In the example system, the linear robot 108 is designed and constructed to operate under vacuum, using load locks 122 and 124 for the interface with the front end robot system 102; however, in example systems where the linear robot is operated at atmospheric pressure, the load locks 122 and 124 as well as the transfer robot 200 may be omitted.

FIG. 2 further shows the linear robot 108. In various example systems, the linear robot 108 conveys wafers along an extended length path. In the example of FIG. 2, the path extends from the transfer robot 200 on one end to the processing cluster 132 on the second end. Thus, in some example systems the linear robot of the linear robot system 108 is said to have only one degree of freedom—the translation is merely back and forth along the extended length path. In other cases, the linear robot associated with the linear robot system 108 may have the ability to change the elevation of a wafer on the robot (i.e., a z-axis translation), and thus in such embodiments the linear robot system 108 may be considered to have two-degrees of freedom. Generically then, in example systems the linear robot of the linear robot system 108 has two degrees of freedom or less.

The example linear robot system defines three example locations where wafer exchange with a processing cluster takes place. In particular, the linear robot 108 defines a first location 116 associated with processing cluster 130, a second location associated with processing cluster 132, and a third location 120 associated with third processing cluster 134. Considering the first location 116 as illustrative of all the locations, in systems where the linear robot system 108 is operated under vacuum, the first location 116 may be characterized by a door 202 that enables access of the cluster robot 142 to the wafer location 204 (though in FIG. 2 the cluster robot 142 is shown in operational relationship with one of its process chambers). In the example systems, the cluster robot 142 may likewise operate in a chamber operated under vacuum, but the chamber is not expressly shown in FIG. 2 so as not to further complicate the drawing. Should the chambers be under vacuum, the pressure level may be the same as the pressure in the chamber within which the linear robot 108 operates, and door 202 may remain open for extended periods in continuous operation. Door 202 could be closed to isolate the chamber containing robot 142 so the chamber can be vented and serviced independently of the linear robot 108. Thus, when a wafer is to be transferred from to the cluster robot 142, the linear robot 108 moves and places a wafer at the location 204, and the cluster robot 142 reaches through the open door 202 and removes the wafer from the linear robot. Likewise, when a wafer is to be transferred from the cluster robot 142, the linear robot 108 places an empty carrier at the location 204, the cluster robot 142 reaches through the open door 202 and places the wafer on the linear robot. The discussion regarding cluster robot 142 is equally valid with respect to operation of the cluster robot 206 associated with processing cluster 132 and cluster robot 208 associated with processing cluster 134.

Still referring to FIG. 2, because of the physical arrangement of the various components, maintenance access may be easily provided to all the processing clusters. For example, maintenance area 210 may be provided on the opposite side of the processing cluster 130 from the linear robot 108. Maintenance area 212 may be provided on the opposite side of the processing cluster 132 from the linear robot 108. Finally, maintenance area 214 may be provided on the opposite side of the processing cluster 134 from the linear robot 108.

Figure 3:
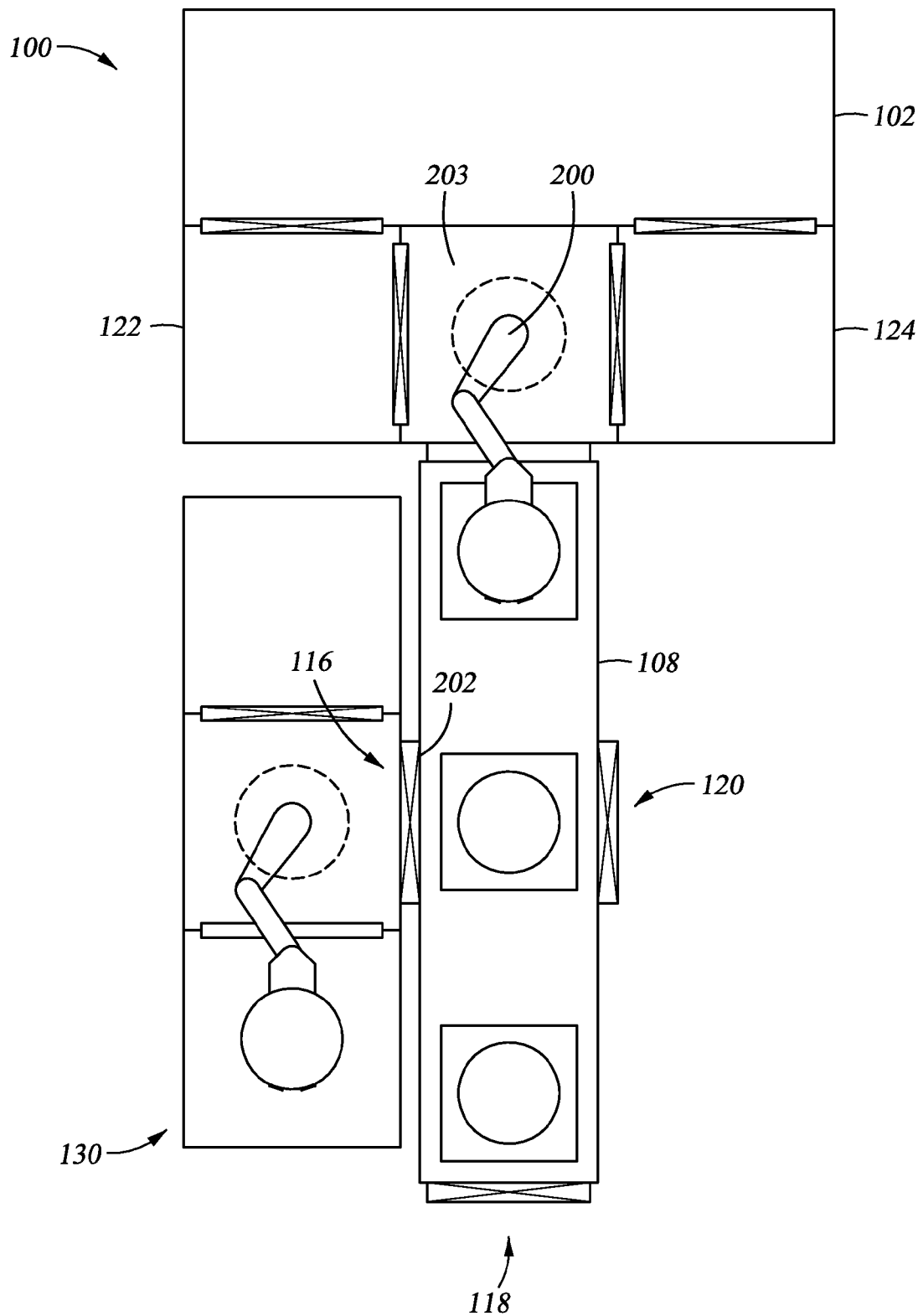
FIG. 3 shows an overhead view of semiconductor processing equipment in accordance with at least some embodiments.

FIG. 3 shows an overhead view of a semiconductor processing system in a different configuration. In particular, FIG. 3 shows semiconductor processing system 100 comprising the front end robot 102 operatively coupled to the linear robot 108 by way of two example load locks 122 and 124. Visible in FIG. 2 is a transfer robot 200 in its own chamber 203 configured to move wafers from the load locks 122 and 124 to the linear robot 108. Likewise, the transfer robot 200 is configured to move wafers from the liner robot 108 to the load locks 122 and 124 for placing back in the wafer carriers. As with respect to the system of FIG. 2, the linear robot 108 of FIG. 3 conveys wafers along an extended length path. Unlike the example of FIG. 2, however, the linear robot 108 is associated with a single processing cluster 130. Nevertheless, the example linear robot 108 still defines three example locations where wafer exchange with a processing cluster may take place. In particular, the linear robot 108 defines a first location 116 associated with processing cluster 130, a second location 118, and a third location 120.

FIG. 3 is thus representative of an initial installation of a semiconductor processing system wherein the front end robot 102 and the linear robot 108 are designed to ultimately interface with a predetermined number of processing clusters, but where initially the system has less than the predetermined number of processing clusters. In this way, the semiconductor processing equipment 100 can be operable for some period of time, transferring wafers to and from the processing cluster 130. Thereafter (e.g., days, weeks, months, even years), additional processing clusters can be added without the need to purchase a new overall piece of equipment. Though the system of FIG. 3 shows three locations at which processing clusters may exchange wafers with the linear robot 108, the predetermined number of locations may be fewer (e.g., two locations), or greater (e.g., five locations).

Figure 4:
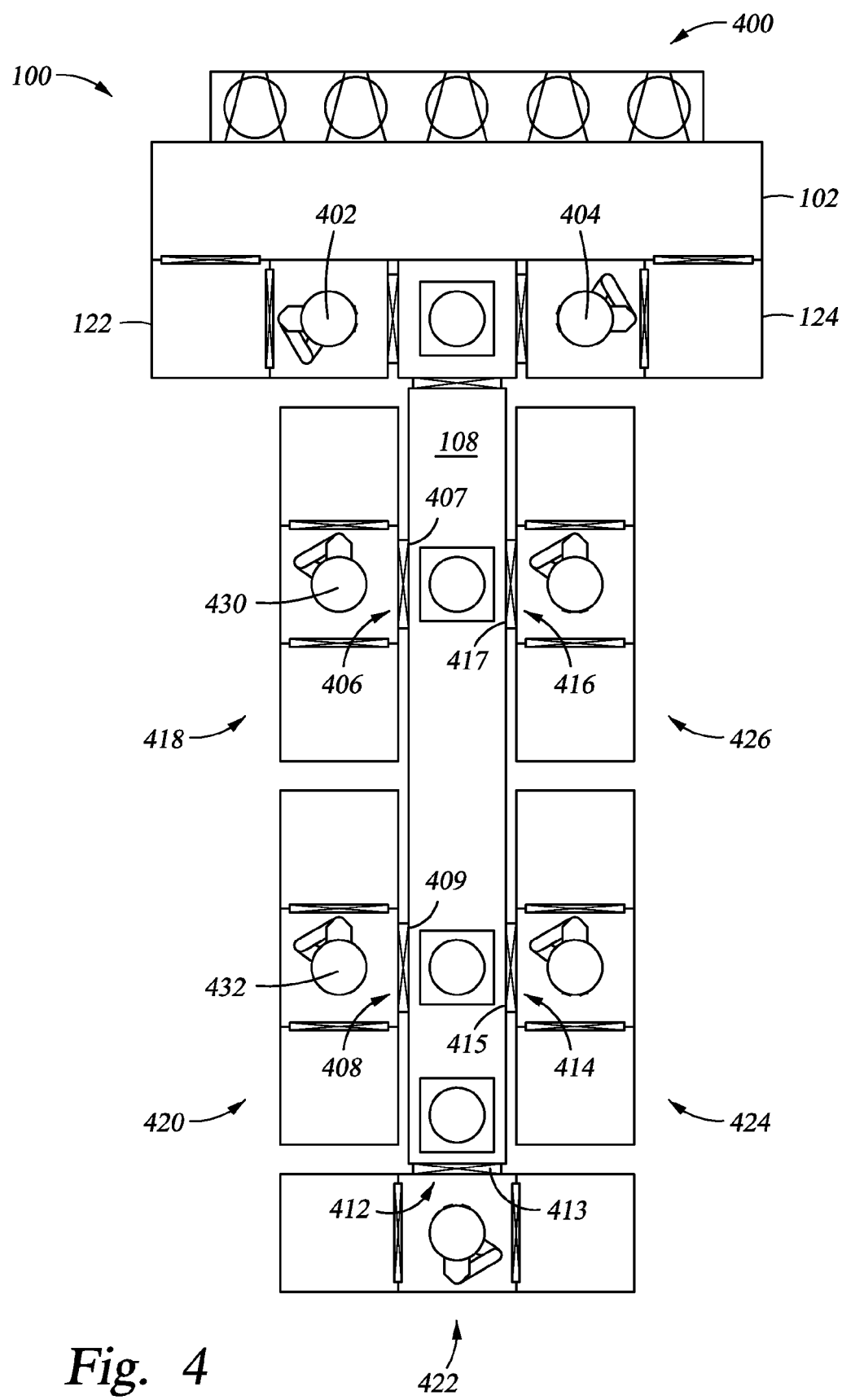
FIG. 4 shows an overhead view of semiconductor processing equipment in accordance with at least some embodiments.

FIG. 4 shows an overhead view of semiconductor processing equipment in accordance with further example systems. In particular, FIG. 4 shows semiconductor processing system 100 comprising the front end robot 102 operatively coupled to the linear robot 108. In the example system of FIG. 4, the front end robot 102 may be designed and constructed for greater throughput, and thus may interface with a greater number of wafer carriers 400 (in the example system, five such wafer carriers). The front end robot 102 of FIG. 4 operatively couples to the linear robot 108 by way two load locks 122 and 124. In the example system, two transfer robots 402 and 404 are provided, one each for each load lock 122 and 124 respectively. Each transfer robot 402 and 404 is configured to move wafers from the load locks 122 and 124, respectively, to the linear robot 108. Likewise, each transfer robot 402 and 404 is configured to move wafers from the linear robot 108 to the load locks 122 and 124, respectively, for placing back in the wafer carriers. It is noted, however, that the single transfer robot 200 and dual load lock system shown in FIGS. 1-3 may likewise be implemented in a five processing cluster system depending upon throughput capability of the processing chambers. That is, if the processing chambers perform relatively slow processes, a single transfer robot may be sufficient. Conversely, the dual transfer robot system of FIG. 4 is not limited to five processing cluster systems, and may be implemented in systems with fewer processing clusters where the processes implemented are short or fast.

As with respect to the previous example systems, the linear robot 108 of FIG. 4 conveys wafers along an extended length path. In particular, in FIG. 4 the linear robot 108 defines a plurality of locations at which wafer exchange with processing clusters takes place, and particularly the linear robot defines five locations at which wafer exchange may take place with processing clusters, being locations 406, 408, 412, 414, and 416. Having five example locations at which wafer exchange takes place enables the system 100 to interface with as many as five processing clusters, though as previously described it is not strictly necessary that all five processing clusters be present at any one time. For example, processing clusters may be added as additional processing chambers are needed within the overall fabrication facility.

As before, the example linear robot 108 operates within the vacuum chamber at pressures less than atmospheric, and thus interfaces with the front end robot system 102 by way of load locks 122 and 124. That is, the front end robot 102 may place wafers within one of the load locks 122 or 124 while the load lock is at atmospheric pressure. The load lock may then be evacuated, and the wafer placed on a linear robot 108 by one of the transfer robots 402 and 404. Likewise for returning wafers, the returning wafers may be placed in a load lock by a respective transfer robot, the load lock vented to atmosphere, and then the front end robot 102 may retrieve the wafer and place the wafer in a wafer carrier. Though not specifically shown with respect to the processing clusters, when the linear robot 108 operates under vacuum, so too do the cluster robots. In some cases, each location at which wafer exchange takes place may have a shuttle gate or door to fluidly isolate the volume within which the cluster robot resides from the volume within which the linear robot resides. In the example system of FIG. 4, exchange location 406 is associated with door 407, exchange location 408 is associated with door 409, exchange location 412 is associated with door 413, exchange location 414 is associated with door 415, and exchange location 416 is associated with door 417. In each case, the door is associated with an aperture through the structure that defines the transfer chamber, but the apertures are not shown in FIG. 4 so as not to unduly complicate the figure. Again, while linear robot 108 of FIG. 4 is described to operate under vacuum, in other cases the linear robot system 108 may be operated at atmospheric pressure (i.e., vacuum chamber not used).

Still referring to FIG. 4, the example semiconductor processing equipment 100 comprises five processing clusters 418, 420, 422, 424, and 426. The processing clusters of FIG. 5 may take the same form, structure, and options as discussed with respect to the previous processing clusters, and thus will not be described again with respect to FIG. 4. It is noted, however, that from an engineering perspective the processing clusters need not be redesigned for use in a system such as FIG. 4 as compared to systems of FIGS. 1-3. In fact, in some cases the processing clusters are modular from an engineering perspective, and a processing cluster may be operational with any linear transfer robot. Thus, designing a system with the example five processing clusters may only imply designing a linear robot 108 of proper length and number of locations at which wafer transfer takes place.

In some example systems, the semiconductor processing equipment 100 may implement a series of process steps. For example, a wafer may be initially processed by one or both the processing chambers of the processing cluster 418. That is, a wafer is placed by the linear robot proximate the cluster robot 430 associated with the processing cluster 418, the cluster robot 430 may remove the wafer from the linear robot and place the wafer in one of the processing chambers of the processing cluster 418. After processing, the cluster robot 430 may remove the wafer from the processing chamber and place the wafer back on the linear robot 108. The linear robot may move the wafer to be proximate the processing cluster 420, and the cluster robot 432 may remove the robot from the linear robot 108 and place the wafer into a processing chamber for further processing. The specification now turns further details regarding the linear robot 108.

FIG. 5 shows a perspective, partial cutaway, view of the system associated with the linear robot 108. In particular, FIG. 5 shows that in example systems the linear robot may be associated with a transfer chamber 109. The example transfer chamber 109 defines an internal volume 500 within which the linear robot 108 resides (as shown behind the cutaway section 502). In the example systems, the vacuum chamber 109 is designed to be operated at pressures less than atmospheric, possibly to reduce the likelihood of particulate contamination of the wafers. Also shown in FIG. 5 are the load locks 122 and 124 in operational relationship to the transfer robot 200 (as shown behind cutaway section 504) within chamber 203. For example, the transfer robot 200 may exchange wafers with load lock 124 through aperture 506, and likewise may exchange wafers with the linear robot through aperture 550.

In order to define the locations at which wafer exchange takes place with the processing clusters, the transfer chamber 109 defines a plurality of apertures. In the view of FIG. 5, two apertures are visible—aperture 510 associated with side wall 511, and aperture 512 associated with end wall 513 (with end wall 513 perpendicular to the side wall 511, and side wall 515). The linear robot 108 of FIG. 5 is similar to the systems of FIGS. 1-3, and thus the aperture 510 may be considered to be associated with processing cluster 134, while aperture 512 may be considered to be associated with processing cluster 132. In many cases, each aperture is associated with a door which selectively opens and closes when wafer exchange is to take place. The doors are illustratively shown in FIG. 2-4. In some cases, the doors are part of the system associated with the transfer chamber system, and in other cases the doors are part of the processing clusters. In yet still other cases, no doors are used, and the cluster robots are exposed to the vacuum in the transfer chamber 109 at all times.

In some systems, depending upon wafer throughput used in the system, the linear robot 108 may comprise only a single wafer shuttle, such as wafer shuttle 520; however, in other systems two or more wafer shuttles may be implemented by the linear robot 108 (e.g., a second wafer shuttle 522). Each wafer shuttle may move along a track or linear bearing, with simultaneous operation implemented by differences in elevation of each wafer shuttle, as shown by FIG. 6.

FIG. 6 shows an elevation view of the transfer chamber and linear robot taken substantially along lines 6-6 of FIG. 5. In particular, FIG. 6 shows the side wall 511 along with parallel side wall 515. In some cases, the transfer chamber 109 may be defined by a substantially transparent lid member 600 (perpendicular to each side wall) such that the movement of the wafer shuttles may be viewed, but the transparency of the lid member 600 is not strictly required. In the example system of FIG. 6, within the internal volume 500 resides two tracks or linear bearings 602 and 604. The first wafer shuttle 520 may be associated with the first linear bearing 602, while the second wafer shuttle 522 may be associated with the second linear bearing 604. As shown, the elevation as between the wafer shuttles 520 and 522 is different such that wafer shuttles 520 and 522 may move independently along the extended length path defined by the system. Again, while a linear robot with two wafer shuttles is shown, one or more wafer shuttles and related systems (e.g., three wafer shuttles) may be implemented as part of the linear robot 108.

FIG. 7 shows a perspective, partial cutaway, view of a processing cluster of example systems. In particular, FIG. 7 shows processing cluster 700, which processing cluster may be illustrative of any of the previous processing clusters. The processing cluster 700 comprises a first processing chamber 702 and a second processing chamber 704, which may be designed and constructed to perform any suitable single- or multi-wafer process (e.g., plasma-based metal etch, plasma-based poly etch, plasma-based ash process, wet or dry wafer cleaning, CVD chamber). FIG. 7 further shows a cluster chamber 706 associated with the cluster robot 708. That is, in systems where the linear robot (not shown in FIG. 7) resides within a transfer chamber operated under vacuum, the cluster robot 708 may likewise be placed within a cluster chamber 706 and be operated under vacuum.

The example cluster robot 708 in FIG. 7 may also be in operational relationship with a buffer area 710. The buffer area 710 may be a single location at which a wafer may be placed to facilitate wafer exchange with the processing chambers and/or the linear robot. For example, when a new wafer to be processed arrives before the current wafer processing is complete, the wafer may be temporarily stored in the buffer area 710. In other cases, the buffer area may store a wafer used for other purposes, such as a "cover wafer" placed in the chamber during a cleaning process to protect the electrodes upon which the wafers sit. Another example is a metrology wafer, where the wafer may be placed in the chamber to test processing parameters such as particle counts, and etch rates.

In some systems, the buffer area 710 implements only a single location for temporary wafer storage; however, in other cases, and as illustrated, the buffer area may comprise a rack member 712 having locations to store multiple wafers. The example rack member 712 has two levels, level 714 and 716, at which a wafer may be placed. In some cases, the rack member 712 may be designed and constructed to move up and down (in the z-axis) as shown by double-headed arrow 718. However, in other systems the rack member 712 may remain stationary, and the cluster robot 708 may have sufficient z-axis capability to exchange wafers with each level of the rack.

Figure 8:
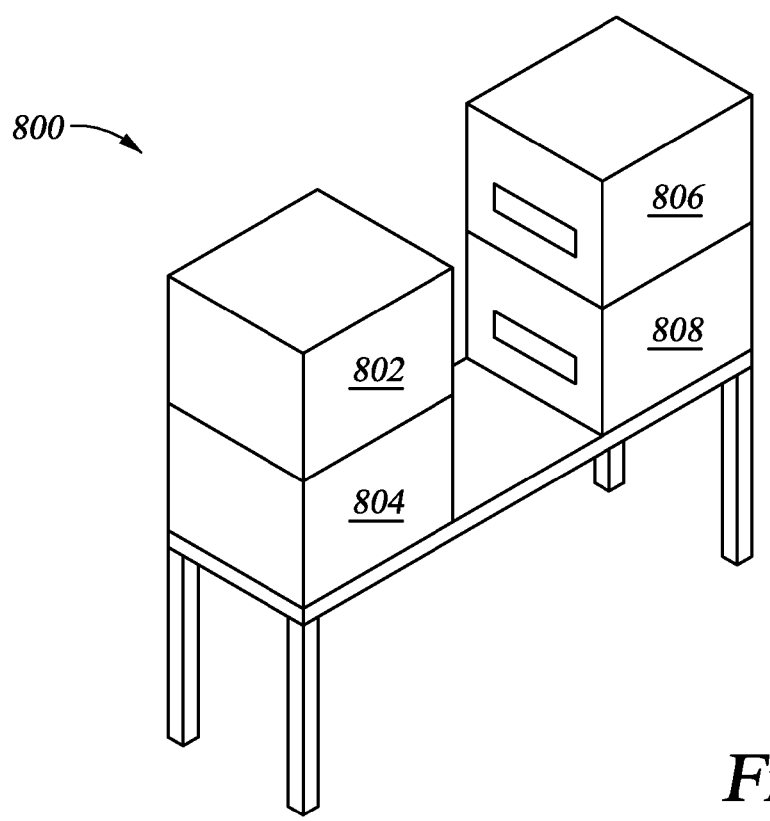
FIG. 8 shows a perspective view of a processing cluster in accordance with at least some embodiments.

FIG. 8 shows a perspective view of a processing cluster of example systems. In particular, FIG. 8 shows processing cluster 800, which processing cluster may be illustrative of any of the previous processing clusters. In the example processing cluster 800, four processing chambers are implemented—two stacked processing chambers 802 and 804 on one side, and two stacked processing chambers 806 and 808 on another side, opposite the cluster robot (not specifically shown). The processing cluster 800 of FIG. 8 is more likely to be implemented in situations where the processing chambers are designed and constructed to be operated at atmospheric pressure (e.g., wet wafer cleaning processes, wet etch processes), but stacked systems may also be implemented for plasma etch processes as well.

The cluster robot associated with FIG. 8 is not shown, but may be of similar design and construction of any of the previously discussed cluster robots, with the difference being that the cluster robot may have sufficient z-translation capability to exchange wafers with all four processing chambers. Moreover, the processing cluster of FIG. 8 is more likely to be operated with a linear robot operated at atmospheric pressure, and thus not implementing a cluster chamber between the processing chambers.

Figure 9:
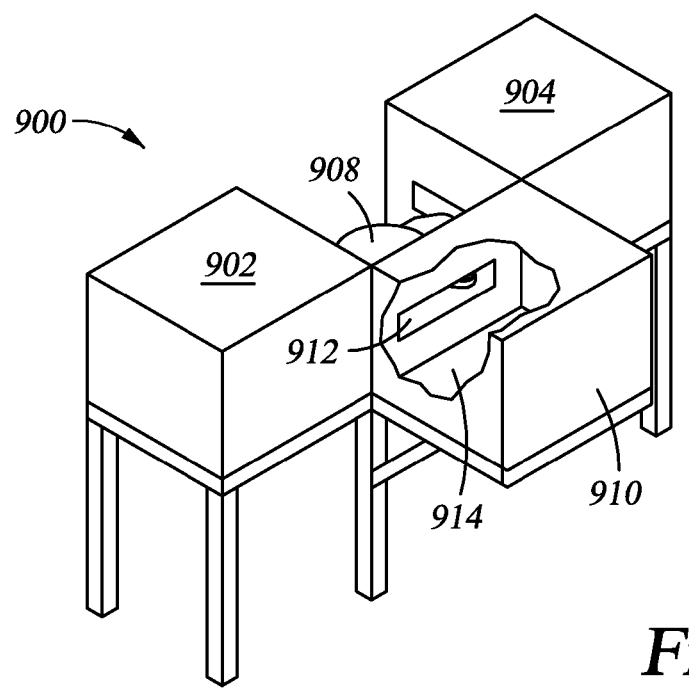
FIG. 9 shows a perspective, partial cutaway, view of a processing cluster in accordance with at least some embodiments.

FIG. 9 shows a perspective, partial cutaway, view of a processing cluster of further example systems. In particular, FIG. 9 shows processing cluster 900, which processing cluster may be illustrative of any of the previous processing clusters. The processing cluster 900 comprises a first processing chamber 902 and a second processing chamber 904, which may be designed and constructed to perform any suitable single- or multi-wafer process (e.g., plasma-based metal etch, plasma-based poly etch, plasma-based ash process, wet or dry wafer cleaning, CVD chamber). FIG. 9 does not expressly show a chamber associated with the cluster robot 908 so as not to unduly complicate the figure, but such a chamber could be present.

The example cluster robot 708 in FIG. 7 may also be in operational relationship with an additional chamber 910. The additional chamber 910 may define an aperture 912 through which the cluster robot 908 may exchange wafers with the interior volume 914 of the chamber 910. The example additional chamber 910 is shown to be the same physical size as the cambers 902 and 904, but such an additional chamber 910 may be larger or smaller as desired. In some example systems, the additional chamber 910 may perform pre- or pose-processing of the wafer (the pre- or post-processing in relation to the processes implemented in the chambers 902 and/or 904). For example, when a new wafer to be processed arrives at the processing cluster 900, the cluster robot 908 may place the wafer in the additional chamber 910 for pre-processing prior to being placed into chamber 902 and/or chamber 904. Likewise, when processing in chamber 902 and/or 904 is complete a wafer may be placed into the additional chamber 910 for post-processing before being placed on the linear robot. In yet still other cases, the additional chamber may perform both pre- and post-processing of a wafer. Any suitable pre- and/or post-processing may be implemented in the additional chamber (e.g., wet clean, dry clean, ash process).

Figure 10:
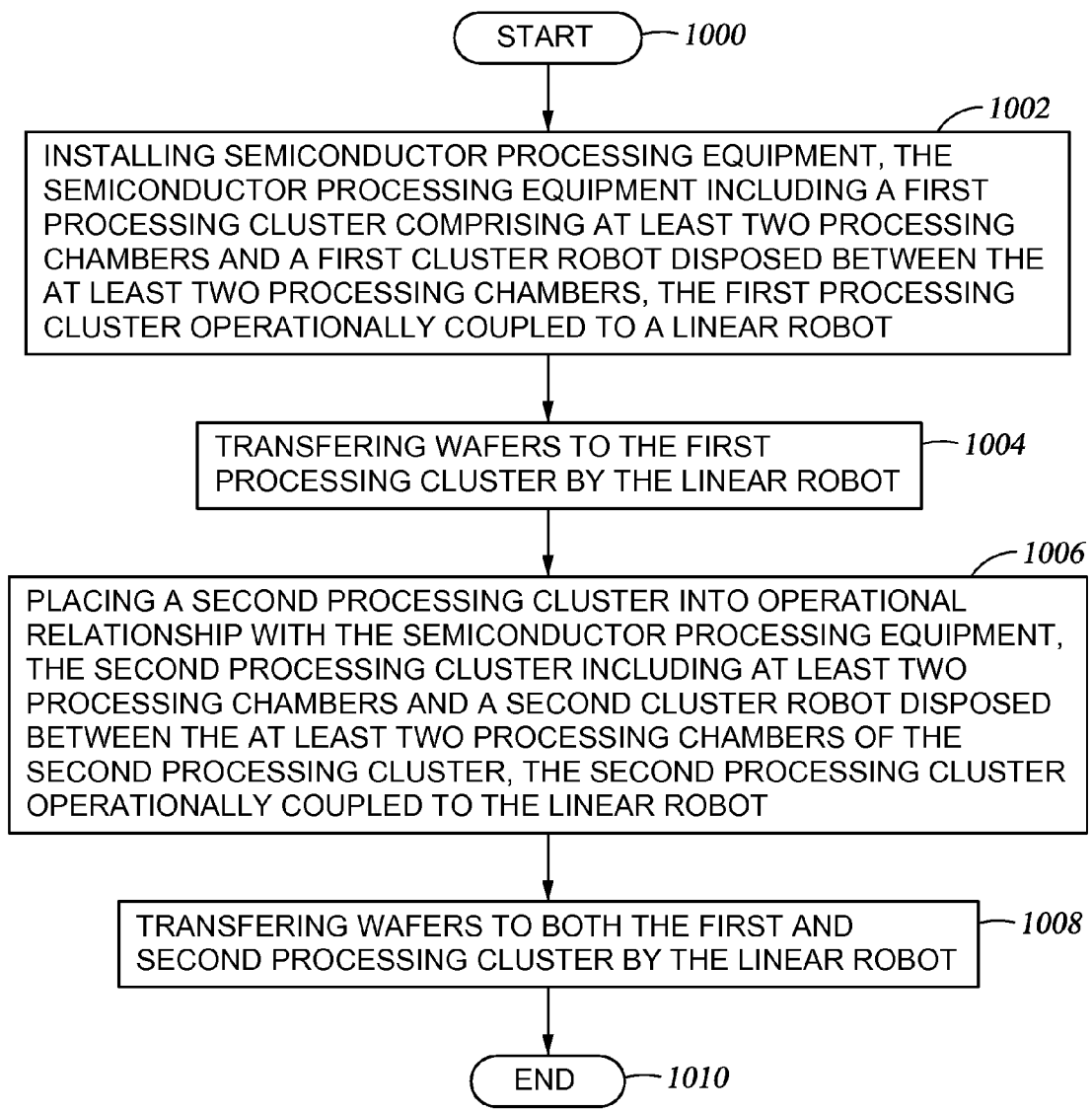
FIG. 10 shows a method in accordance with at least some embodiments.

FIG. 10 illustrates a method in accordance with example embodiments. In particular, the method starts (block 1000) and comprises: installing semiconductor processing equipment, the semiconductor processing equipment including a first processing cluster comprising at least two processing chambers and a first cluster robot disposed between the at least two processing chambers, the first processing cluster operationally coupled to a linear robot (block 1002); transferring wafers to the first processing cluster by the linear robot (block 1004); and placing a second processing cluster into operational relationship with the semiconductor processing equipment, the second processing cluster including at least two processing chambers and a second cluster robot disposed between the at least two processing chambers of the second processing cluster, the second processing cluster operationally coupled to the linear robot (block 1006); and transferring wafers to both the first and second processing cluster by the linear robot (block 1008). Thereafter, the method ends (block 1010).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system comprising:
a front end robot configured to pull individual wafers from at least one wafer carrier;
a linear robot in operational relationship with the front end robot, wherein the linear robot is configured to (i) receive the wafers from the front end robot, and (ii) move the wafers along a path;
a first processing chamber;
a second processing chamber;
a first cluster robot disposed between the first processing chamber and the second processing chamber; and
a rack adjacent the first processing chamber and the second processing chamber and isolated from the linear robot preventing a direct transfer of the wafers between the linear robot and the rack, wherein the rack is configured to store at a same time a plurality of the wafers for subsequent processing in one or more of the first processing chamber and the second processing chamber, wherein the plurality of wafers are stacked on the rack, and wherein the first cluster robot is configured to transfer the plurality of the wafers
between (i) the linear robot, and (ii) the first processing chamber and the second processing chamber, and
between (i) the rack, and (ii) the first processing chamber and the second processing chamber.

2. The system of claim 1, further comprising:
a third processing chamber;
a fourth processing chamber; and
a second cluster robot disposed between the third processing chamber and the fourth processing chamber,
wherein the second cluster robot is configured to transfer a second plurality of the wafers
between (i) the linear robot, and (ii) the third processing chamber and the fourth processing chamber, and
between the third processing chamber and the fourth processing chamber.

3. The system of claim 2, further comprising:
a fifth processing chamber;
a sixth processing chamber; and
a third cluster robot disposed between the fifth processing chamber and the sixth processing chamber,
wherein the third cluster robot is configured to transfer a third plurality of the wafers
between (i) the linear robot, and (ii) the fifth processing chamber and the sixth processing chamber, and
between the fifth processing chamber and the sixth processing chamber.

4. The system of claim 1, wherein the first cluster robot is configured to: transfer the plurality of the wafers from the linear robot to the rack;
transfer the plurality of the wafers from the rack to the linear robot; transfer the plurality of the wafers from the rack to the first processing chamber; transfer the plurality of the wafers from the first processing chamber to the rack; transfer the plurality of the wafers from the rack to the second processing chamber; and transfer the plurality of the wafers from the second processing chamber to the rack.

5. The system of claim 1, further comprising:
a transfer chamber with an internal volume, wherein the internal volume defines the path, and wherein the transfer chamber is configured to be operated such that pressures within the internal volume are less than an atmospheric pressure,
wherein at least a portion of the linear robot resides within the transfer chamber;
a first door in operational relationship with a first aperture of the transfer chamber, wherein the front end robot is configure to provide the wafers, pulled from the wafer carrier, to the linear robot through the first aperture;
a second door in operational relationship with a second aperture of the transfer chamber, wherein the cluster robot is configured to receive the plurality of the wafers from the linear robot through the second aperture; and
a third door at the end of the path and in operational relationship with a third aperture of the transfer chamber.

6. The system of claim 5, further comprising a cluster chamber with an internal volume, wherein:
the cluster chamber is configured to be operated, such that pressures within the internal volume of the cluster chamber are at a pressure less than the atmospheric pressure;
the cluster chamber is selectively fluidly coupled to the internal volume of the transfer chamber by way of the second door and second aperture; and
the first cluster robot is at least partially disposed within the cluster chamber.

7. The system of claim 1, further comprising a transfer chamber, wherein:
at least a portion of the linear robot resides within the transfer chamber; and
the transfer chamber comprises
a first side wall
a second side wall parallel to the first side wall and
an end wall perpendicular to both the first side wall and the second side wall,
wherein
a first aperture is defined by a portion of the first side wall,
a second aperture is defined by a portion of the second side wall, and
a third aperture is defined by a portion of the end wall.

8. The system of claim 1, further comprising a transfer chamber, wherein:
at least a portion of the linear robot resides within the transfer chamber; and
the transfer chamber comprises
a first side wall,
a second side wall parallel to the first side wall, and
an end wall perpendicular to both the first side wall and the second side wall,
wherein
a first aperture is defined by a portion of the first side wall,
the portion of the first side wall is at a first distance from the end wall,
a second aperture is defined by a second portion of the first side wall,
the second portion of the second first side wall is at a second distance from the end wall,
the second distance is less than the first distance,
a third aperture is defined by a second portion of the second side wall, and
the third aperture is a same distance from the end wall as the second aperture.

9. The system of claim 1, wherein:
the rack is configured to store a cover wafer or a metrology wafer; and
the cluster robot is configured to, during a cleaning process, transfer the cover wafer between (i) the rack and (ii) the first processing chamber or the second processing chamber, wherein the cover wafer protects electrodes in the first processing chamber or the second processing chamber during the cleaning process.

10. The system of claim 1, wherein:
the rack is configured to store a metrology wafer; and
the cluster robot is configured to, during a test of a plurality of parameters, transfer the metrology wafer between (i) the rack and (ii) the first processing chamber or the second processing chamber, wherein the plurality of parameters include particle counts and etch rates.

11. The system of claim 1, wherein the rack is isolated from the linear robot via the first cluster robot.

12. The system of claim 1, wherein:
the rack comprises a member;
the member is configured to move vertically in the rack;
the plurality of wafers are provided on the member to form a stack of wafers; and the member moves in a vertical direction as the plurality of wafers are stacked on the member.

13. The system of claim 1, wherein:
the first cluster robot is configured to receive a first wafer from the linear robot prior to the first processing chamber or the second processing chamber finishing processing of a second wafer;
the plurality of wafers do not include the first wafer or the second wafer;
if the first cluster robot receives the first wafer from the linear robot prior to the first processing chamber or the second processing chamber finishing processing the second wafer, the first cluster robot is configured to store the first wafer in the rack until the first processing chamber or the second processing chamber finishes processing the second wafer; and
the first cluster robot is configured to transfer the first wafer from the rack to one of the first processing chamber or the second processing chamber when the first processing chamber or the second processing chamber is finished processing the second wafer.

14. The system of claim 13, wherein:
if the first cluster robot receives the first wafer subsequent to the first processing chamber or the second processing chamber finishing processing the second wafer and if no wafer is stored in the rack, the first cluster robot is configured to provide the first wafer to the first processing chamber or the second processing chamber;
if the first cluster robot receives the first wafer subsequent to the first processing chamber or the second processing chamber finishing processing the second wafer and if a third wafer is stored in the rack, the first cluster robot is configured to (i) provide the third wafer to the first processing chamber or the second processing chamber, and (ii) store the first wafer in the rack; and
the plurality of wafers comprise the third wafer.

15. A system comprising:
a front end robot configured to pull individual wafers from at least one wafer carrier;
a transfer chamber comprising a linear robot, a first linear bearing, a second linear bearing, a first wafer shuttle and a second wafer shuttle, wherein the linear robot is in operational relationship with the front end robot, wherein the linear robot is configured to (i) receive the wafers from the front end robot, and (ii) move the wafers along a path, wherein the first linear bearing and the second linear bearing are mounted on a same surface of the transfer chamber, wherein the first wafer shuttle rides on the first linear bearing and not on the second linear bearing, wherein the second wafer shuttle rides on the second linear bearing and not on the first linear bearing, wherein the first wafer shuttle and the second wafer shuttle hold respective ones of the wafers while being moved along the path, and wherein the first wafer shuttle moves along the path independent of the second wafer shuttle;
a first processing chamber;
a second processing chamber; and
a cluster robot disposed between the first processing chamber and the second processing chamber, wherein the cluster robot is configured to transfer a plurality of the wafers between (i) the linear robot, and (ii) the first processing chamber and the second processing chamber,
wherein during movement of the first wafer shuttle and the second wafer shuttle and during a first period of time, a portion of the second wafer shuttle is above the first wafer shuttle such that the portion of the second wafer shuttle is vertically overlapping the first wafer shuttle, and
wherein during movement of the first wafer shuttle and the second wafer shuttle and during a second period of time, a portion of the second wafer shuttle is not above the first wafer shuttle such that the portion of the second wafer shuttle is not vertically overlapping the first wafer shuttle.

16. The system of claim 15, further comprising a rack adjacent the first processing chamber and the second processing chamber and isolated from the linear robot preventing a direct transfer of the wafers between the linear robot and the rack, wherein the rack is configured to store at a same time the plurality of the wafers,
wherein the cluster robot is configured to transfer the plurality of the wafers between (i) the rack, and (ii) the first processing chamber and the second processing chamber.

* * * * *